United States Patent
Aida et al.

(10) Patent No.: US 7,535,255 B2
(45) Date of Patent: May 19, 2009

(54) LOGIC INTEGRATED CIRCUIT HAVING DYNAMIC SUBSTITUTION FUNCTION, INFORMATION PROCESSING APPARATUS USING THE SAME, AND DYNAMIC SUBSTITUTION METHOD OF LOGIC INTEGRATED CIRCUIT

(75) Inventors: Nobuyoshi Aida, Kawasaki (JP); Hiroshi Murakami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/277,625

(22) Filed: Mar. 28, 2006

(65) Prior Publication Data

US 2006/0236209 A1 Oct. 19, 2006

(30) Foreign Application Priority Data

Mar. 31, 2005 (JP) ............................. 2005-102661
Oct. 27, 2005 (JP) ............................. 2005-313105

(51) Int. Cl.
*G06F 7/38* (2006.01)
*H01L 25/00* (2006.01)

(52) U.S. Cl. .................... 326/41; 326/37; 326/47; 326/101

(58) Field of Classification Search .................. 326/41
See application file for complete search history.

(56) References Cited

U.S. PATENT DOCUMENTS

| | | | | | |
|---|---|---|---|---|---|
| 5,485,102 | A | * | 1/1996 | Cliff et al. | 326/10 |
| 5,498,975 | A | * | 3/1996 | Cliff et al. | 326/10 |
| 6,954,083 | B1 | * | 10/2005 | Thornley et al. | 326/16 |
| 2005/0264318 | A1 | * | 12/2005 | Chan et al. | 326/41 |

FOREIGN PATENT DOCUMENTS

| | | |
|---|---|---|
| JP | 7-273837 | 10/1995 |
| JP | 8-44581 | 2/1996 |
| JP | 2000-81991 | 3/2000 |

* cited by examiner

*Primary Examiner*—Rexford Barnie
*Assistant Examiner*—Thienvu V Tran
(74) *Attorney, Agent, or Firm*—Staas & Halsey LLP (57) ABSTRACT

A logic integrated circuit reconfigures a reconfigurable circuit to a circuit having the function of a fixed circuit at the time of a fault in the fixed circuit. The fixed circuits are divided into a plurality of functional circuit blocks, which are connected to programmable buses. Reconfigurable circuits corresponding to each functional circuit block are provided. In this configuration, the range of reconfiguration is limited to the block including the defective portion, so substitution processing is completed within a short time. Further, in the range which is not affected by the substitution processing, the operation can be continued even during the substitution processing.

18 Claims, 8 Drawing Sheets

| UPSTREAM | DOWNSTREAM | DETECTION RESULT |
|---|---|---|
| Error | Error | DEFECT IN UPSTREAM BLOCK |
| Normal | Error | DEFECT IN DOWNSTREAM BLOCK |
| Error | Normal |  |
| Normal | Normal |  |

LOGIC INTEGRATED CIRCUIT HAVING DYNAMIC SUBSTITUTION FUNCTION, INFORMATION PROCESSING APPARATUS USING THE SAME, AND DYNAMIC SUBSTITUTION METHOD OF LOGIC INTEGRATED CIRCUIT

CROSS-REFERENCE TO RELATED APPLICATIONS

This application is based upon and claims the benefit of priority from the prior Japanese Patent Application No. 2005-102661, filed on Mar. 31, 2005, and the prior Japanese Patent Application No. 2005-313105, filed on Oct. 27, 2005, the entire contents of which are incorporated herein by reference.

BACKGROUND OF THE INVENTION

1. Field of the Invention

The present invention relates to a logic integrated circuit having a dynamic substitution function when a fault occurs in one fixed circuit block, by programming in a substitution circuit block the function of a fixed circuit block in which the fault is detected, thereby performing self-repair, and an information processing apparatus using the logic integrated circuit, and a dynamic substitution method of the logic integrated circuit.

2. Description of the Related Art

In a LSI (Large Scale Integration) circuit of which has highly integrated, a fault in one point may produce an extreme damage on the entire system, and bring about the suspension of system operation for a long time. To cope with such a problem, conventionally, the entire LSI circuit has been structured of FPGA (Field Programmable Gate Array), and a certain area in the FPGA is programmed into a plurality of circuit blocks having different functions, while the remaining area has been structured of substitution blocks. By the use of such a structure, it has been proposed that, when a fault occurs in one circuit block, a substitution block in the FPGA is programmed so as to perform the function of the circuit block having the fault, so as to achieve self-reconfiguration (for example, Japanese Unexamined Patent Publication No. Hei-8-044581).

Further, in an information processing unit having a plurality of fixed circuit LSIs, it has also been proposed that, with the provision of an FPGA circuit for substitution, when a fault is detected in a fixed circuit chip, a control circuit in the information processing unit programs the FPGA circuit so as to perform the function of the circuit having the fault, so as to achieve self-reconfiguration (for example, Japanese Unexamined Patent Publication Nos. Hei-7-273837 and 2000-081991.)

However, according to the first conventional art, the entire LSI is structured of less integrated FPGA having a limited number of gates, and therefore, it is difficult to obtain a large-scale circuit. Furthermore, because the overall circuit block is to be reconfigured even when a portion of the circuit becomes faulty, a substantial time is required for the reconfiguration. This impedes nonstop operation, and reduction of downtime cannot be achieved. Therefore, it is hard to apply the first conventional art to an information processing unit, such as a server, in which nonstop operation and minimization of the downtime is required.

Meanwhile, according to the second conventional art, it takes a long time for reconfiguration, because the entire circuit is to be reconfigured even when the fault occurs in a portion of the circuit. This impedes nonstop operation, and reduction of downtime cannot be achieved. Since the abnormality is decided in the control portion side, it is difficult to achieve in an LSI of complicated structure.

SUMMARY OF THE INVENTION

Accordingly, it is an object of the present invention to provide a logic integrated circuit having a dynamic substitution function for performing reconfiguration in a short time and reducing the downtime in single logic integrated circuit, and an information processing apparatus using the logic integrated circuit, and a dynamic substitution method of the logic integrated circuit.

It is another object of the present invention to provide a logic integrated circuit having a reconfigurable dynamic substitution function even the logic integrated circuit is complicated and large in scale, and an information processing apparatus using the logic integrated circuit, and a dynamic substitution method of the logic integrated circuit.

It is still another object of the present invention to provide a logic integrated circuit having a dynamic substitution function for shortening a reconfiguration time and reducing the downtime, by reconfiguring only an abnormal portion in a fixed circuit block, and an information processing apparatus using the logic integrated circuit, and a dynamic substitution method of the logic integrated circuit.

It is still another object of the present invention to provide a logic integrated circuit having a dynamic substitution function, for performing reconfiguration operation by a control portion at high speed, by detecting an abnormality of a fixed circuit block by means of the own fixed circuit block, and an information processing apparatus using the logic integrated circuit, and a dynamic substitution method of the logic integrated circuit.

According to the present invention in order to achieve the aforementioned object, a logic integrated circuit having a dynamic substitution function includes a circuit being divided into a plurality of functional circuit blocks; a programmable bus for connecting the each divided functional circuit block; a reconfigurable circuit; a memory for storing reconfiguration data of the functional circuit blocks; and a control circuit for reading out from the memory the reconfiguration data of the functional circuit block having the detected error, and reconfiguring the reconfigurable circuit into the functional circuit block having the detected error, using the reconfiguration data in response to an error detection of the functional circuit block.

Further, according to the present invention, an information processing apparatus including a logic integrated circuit having a dynamic substitution function. The logic integrated circuit includes a circuit being divided into a plurality of functional circuit blocks; a programmable bus for connecting the each divided functional circuit block; a reconfigurable circuit; a memory for storing reconfiguration data of the functional circuit blocks; and a control circuit for reading out from the memory the reconfiguration data of the functional circuit block having the detected error, and reconfiguring the reconfigurable circuit into the functional circuit block having the detected error, using the reconfiguration data in response to an error detection of the functional circuit block.

Still further, according to the present invention, a dynamic substitution method of a logic integrated circuit includes the steps of: detecting an error in a functional circuit block in the circuit; reading out reconfiguration data of the functional circuit block having the detected error from a memory storing the reconfiguration data of the functional circuit block; and reconfiguring a reconfigurable circuit into the functional circuit block having the detected error, using the reconfiguration data.

According to the present invention, preferably, the programmable bus is set so as to connect the plurality of functional circuit blocks related to the single circuit, and wherein the control circuit disconnects the functional circuit block having the detected error from the programmable bus, and connects the reconfigured circuit to the programmable bus to connect the reconfigured circuit to the functional circuit blocks other than the functional circuit block having the detected error.

According to the present invention, preferably, each of the plurality of functional circuit blocks further includes an error detection circuit for detecting an error in a transmission signal or a reception signal transferred among the plurality of functional circuit blocks, and the functional circuit blocks identifies the functional circuit block producing the error by examining an error occurrence state in the error detection circuit.

According to the present invention, preferably, the circuit further includes a comparison circuit provided in at least one of the plurality of functional circuit blocks for performing transmission and reception, and for identifying the functional circuit block producing the error, by examining the error occurrence state in the error detection circuit.

According to the present invention, preferably, on receipt of the result of identification from the comparison circuit, the control circuit identifies the reconfigurable circuit corresponding to the functional circuit block having the detected error.

According to the present invention, preferably, the control circuit further includes a map for storing allocation of the plurality of functional circuit blocks, and in response to the error detection in the functional circuit block, the control circuit identifies the functional circuit block having the detected error and the reconfigurable circuit corresponding to the functional circuit block, by referring to the map.

According to the present invention, preferably, the control circuit updates the map in response to the reconfiguration completion of the identified reconfigurable circuit into the functional circuit block having the detected error.

According to the present invention, preferably, the circuit includes a plurality of fixed circuits, and the reconfigurable circuits includes a plurality of reconfigurable circuit blocks provided correspondingly to the plurality of functional circuit blocks, and the control circuit identifies the reconfigurable circuit block corresponding to the functional circuit block having the detected error and reconfigures the identified reconfigurable circuit block into the functional circuit block having the detected error.

According to the present invention, preferably, the control circuit disconnects the functional circuit block having the detected error from the programmable bus and connects the reconfigured circuit to the programmable bus.

According to the present invention, preferably, the reconfigurable circuit includes a plurality of reconfigurable circuit blocks, and the control circuit operates that the circuit divided into the plurality of functional circuit blocks and the reconfigurable circuit divided into the plurality of blocks are grouped.

According to the present invention, preferably, the reconfigurable circuit is constituted of an FPGA circuit.

Further scopes and features of the present invention will become more apparent by the following description of the embodiments with the accompanied drawings.

DETAILED DESCRIPTION OF THE INVENTION

The preferred embodiment of the present invention is described hereinafter, in order of the configuration of a logic integrated circuit, substitution processing in case of a non-correctable (damaged) error, substitution processing in case of a correctable (recoverable) error, and other embodiments. However, it is noted that the scope of the present invention is not limited to the embodiments described below.

Logic Integrated Circuit Configuration

Figure 1:
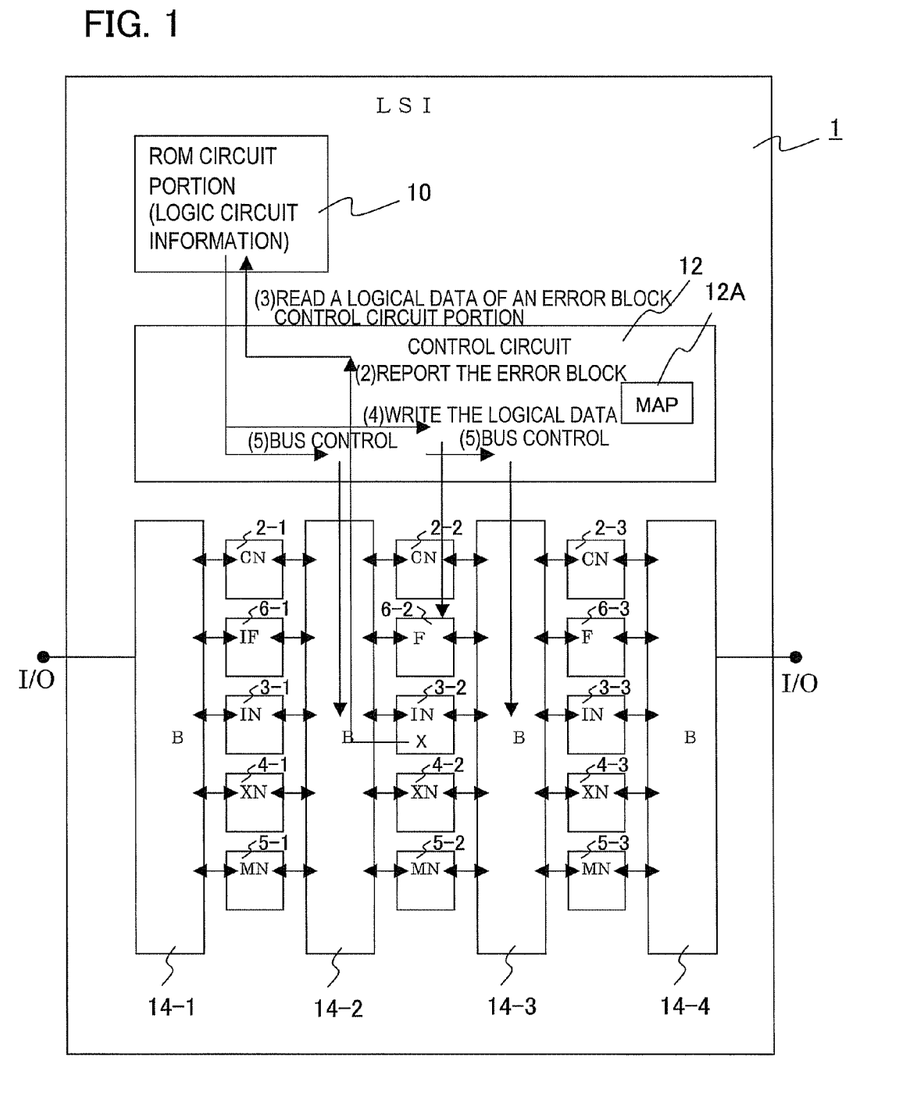
FIG. 1 shows a configuration diagram of a logic integrated circuit according to one embodiment of the present invention.
Figure 2:
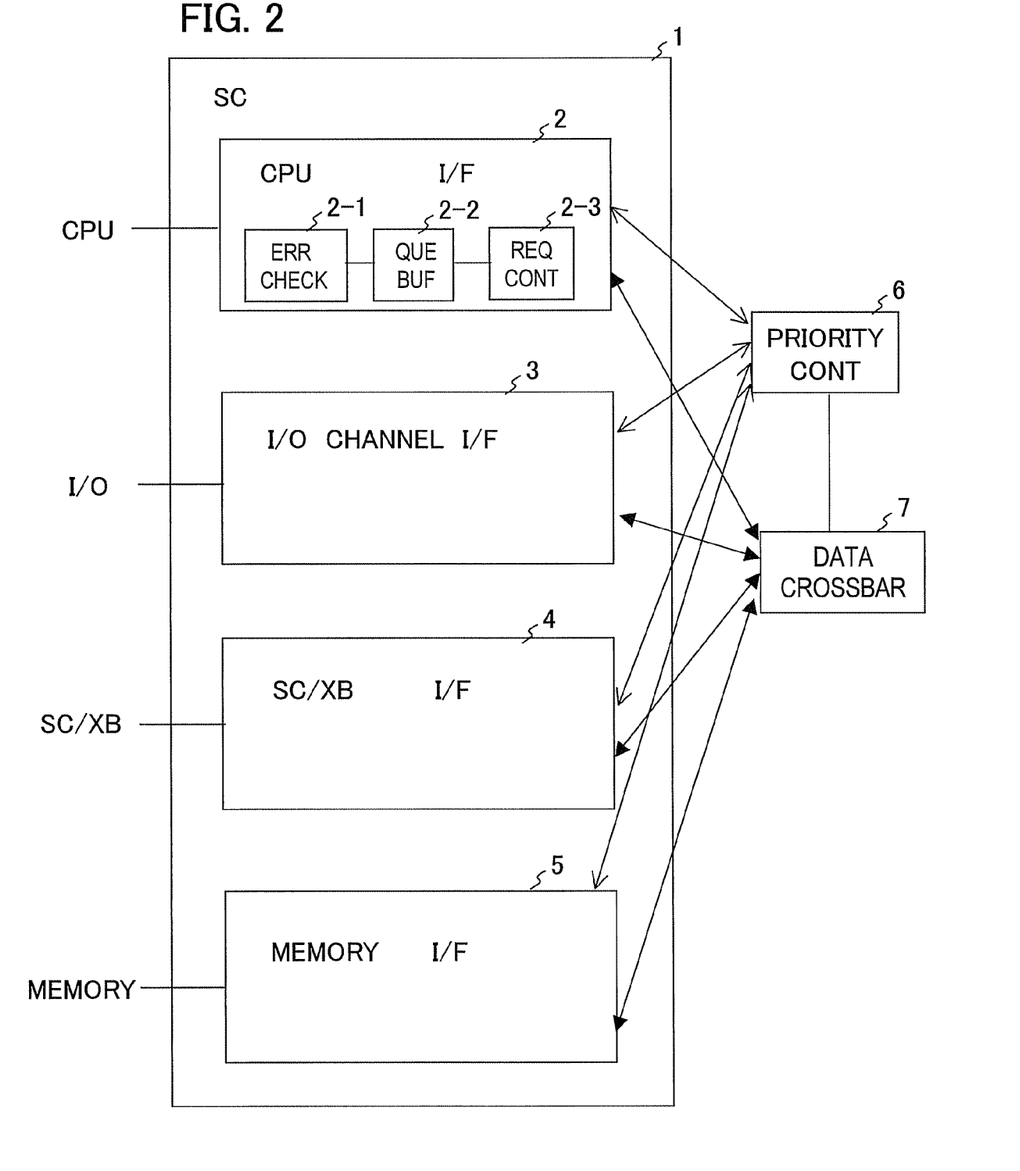
FIG. 2 shows a configuration diagram of a computer system in which the circuit shown in FIG. 1 is used.

FIG. 1 shows a configuration diagram of a logic integrated circuit according to one embodiment of the present invention. FIG. 2 shows a configuration diagram of a computer system in which the circuit shown in FIG. 1 is used. Additionally, by way of example, the logic integrated circuit shown in FIG. 1 illustrates a system controller.

As shown in FIG. 1, a plurality of fixed circuit blocks are divided with an arbitrary scale, and these divided blocks are connected by buses of which connection can be changed by means of programs. Here, each single circuit block 2, 3, 4 or 5 is divided into three circuit blocks 2-1, 2-2, 2-3; 3-1, 3-2, 3-3; 4-1, 4-2, 4-3; and 5-1, 5-2, 5-3.

Then, a first divided circuit block group 2-1, 3-1, 4-1 and 5-1 is connected to the outside by a first programmable bus 14-1, and also connected to a second divided circuit block group 2-2, 3-2, 4-2 and 5-2 by a second programmable bus 14-2. Further, the second divided circuit block group 2-2, 3-2, 4-2 and 5-2 are connected to a third divided circuit block group 2-3, 3-3, 4-3 and 5-3 by a third programmable bus 14-3, as well as connected to the first divided circuit block group 2-1, 3-1, 4-1 and 5-1 by the second programmable bus 14-2.

The third divided circuit block group 2-3, 3-3, 4-3 and 5-3 is connected to the outside by a fourth programmable bus 14-4, as well as connected to the second divided circuit block group 2-2, 3-2, 4-2 and 5-2 by the third programmable bus 14-3.

The above circuit block groups 2-1 to 2-3, 3-1 to 3-3, 4-1 to 4-3 and 5-1 to 5-3 are constituted of non-reconfigurable fixed circuit blocks (non-FPGA blocks), respectively.

Meanwhile, a reconfigurable circuit block (FPGA block) 6 is divided with an arbitrary scale in a similar manner. More specifically, the reconfigurable circuit block 6 is divided into three circuit blocks 6-1, 6-2 and 6-3, which are allocated correspondingly to the first, the second and the third circuit blocks 2-1 (3-1, 4-1, 5-1), 2-2 (3-2, 4-2, 5-2) and 2-3 (3-3, 4-3, 5-3) of the fixed circuit blocks 2, 3, 4 and 5, so as to be connected by programmable buses 14-1, 14-2, 14-3 and 14-4.

Namely, an integrated circuit (LSI) is divided into a plurality of circuit blocks, and a group is formed on a basis of a certain number of blocks. For each group, each circuit block 6-1, 6-2 or 6-3, which is reconfigurable by means of a program (hereafter referred to as 'programmed reconfigurable'), is allocated. Here, the ratio of the number of non-reconfigurable circuit blocks to the number of reconfigurable circuit blocks is arbitrary. However, each the reconfigurable circuit block 6-1, 6-2 or 6-3 can only be substituted for the circuit block within the same group, i.e. the circuit block 2-1 (3-1, 4-1, 5-1), 2-2 (3-2, 4-2, 5-2) or 2-3 (3-3, 4-3, 5-3).

A ROM (Read Only Memory) 10 stores logic circuit information for reconfiguring each divided circuit block. A control circuit 12 includes a map 12A indicating the allocation of each circuit block. On receiving a notification of abnormality from the divided fixed circuit block 2-2, etc., the control circuit 12 identifies the circuit block group in which the relevant abnormality occurs, and when substitution is necessary, reconfigures the reconfigurable circuit block belonging to the circuit block group in which the abnormality occurs to the circuit block function in which the abnormality occurs, and also switches the programmable bus connection.

With such a configuration, by configuring an ordinary circuit with a divided fixed circuit (non-FPGA), it becomes possible to limit a necessary reconfiguration range. Thus, fast circuit restoration, in particular, substitution operation (non-stop recovery) maintaining continuous circuit operation can be achieved.

Referring to FIG. 2, an example of the integrated circuit is explained concretely. In this example, the LSI circuit constitutes a system controller. The system controller (logic integrated circuit) 1 is connected to a non-illustrated CPU, an I/O, another system controller (SC)/crossbar switch (XB) and a memory, thereby providing a path for exchanging commands and data.

For this purpose, the system controller 1 includes interfaces for the CPU, the I/O, the SC/XB and the memory. Namely, the system controller 1 includes a CPU interface circuit 2, an I/O channel interface circuit 3, an SC/XB interface circuit 4, and a memory interface circuit 5. These circuits 2, 3, 4 and 5 have different circuit configurations depending on the bus specifications (transfer speed, transmission format, and error detection/correction method) of a unit to be connected.

Further, the CPU interface circuit 2, I/O channel interface circuit 3, SC/XB interface circuit 4 and memory interface circuit 5 are respectively connected to a priority controller 6 and a data crossbar switch 7.

The priority controller 6 determines a priority order among connection requests from the CPU interface circuit 2, I/O channel interface circuit 3, SC/XB interface circuit 4 and memory interface circuit 5. According to the determined priority order, the data crossbar switch 7 connects between two circuits out of the CPU interface circuit 2, I/O channel interface circuit 3, SC/XB interface circuit 4 and memory interface circuit 5, as a pair of a connection source and a connected destination, so as to select a data exchange path.

In such an interface circuit, for example, the CPU interface circuit 2 is divided into error detection/correction circuit block 2-1, queue & buffer 2-2 and request control circuit 2-3, which are also applicable to the cases of the channel interface circuit 3, SC/XB interface circuit 4 and memory interface circuit 5.

The above divided circuit blocks correspond to circuit blocks 2-1, 2-2 and 2-3 shown in FIG. 1. Also, in the aforementioned programmable buses 14-1, 14-2, 14-3 and 14-4, the switches thereof are set by a program stored in a ROM 10 shown in FIG. 1, so as to connect circuit blocks 2-1, 2-2 and 2-3.

Thus, by use of the above program, the relationship of switch connection in the programmable buses can be changed. Namely, the reconfigurable programmable buses connect between the circuit blocks. Each circuit block 2-1 or the like has an error detection function.

Figure 3:
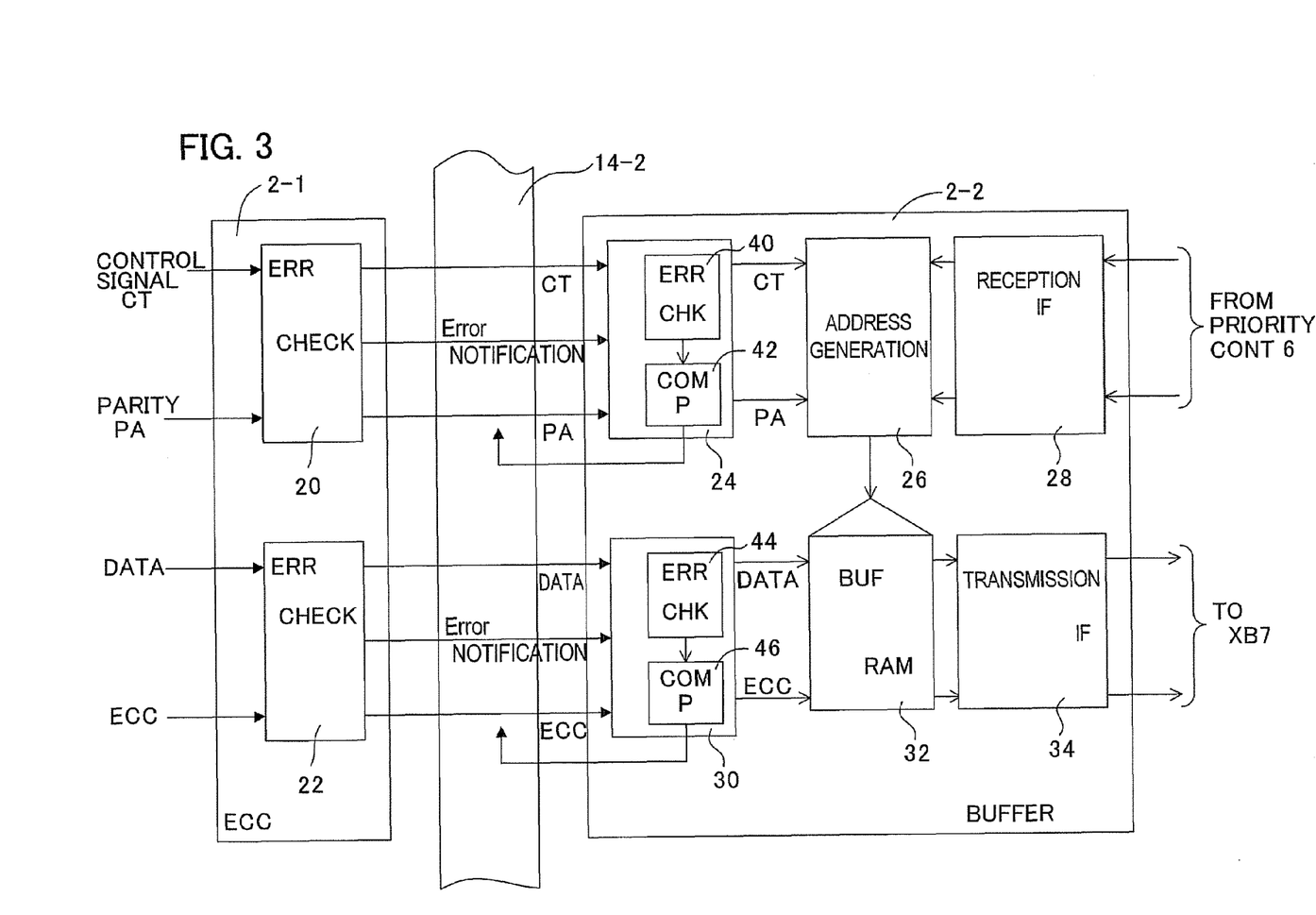
FIG. 3 shows a detailed circuit block diagram shown in FIGS. 1 and 2.
Figure 4:
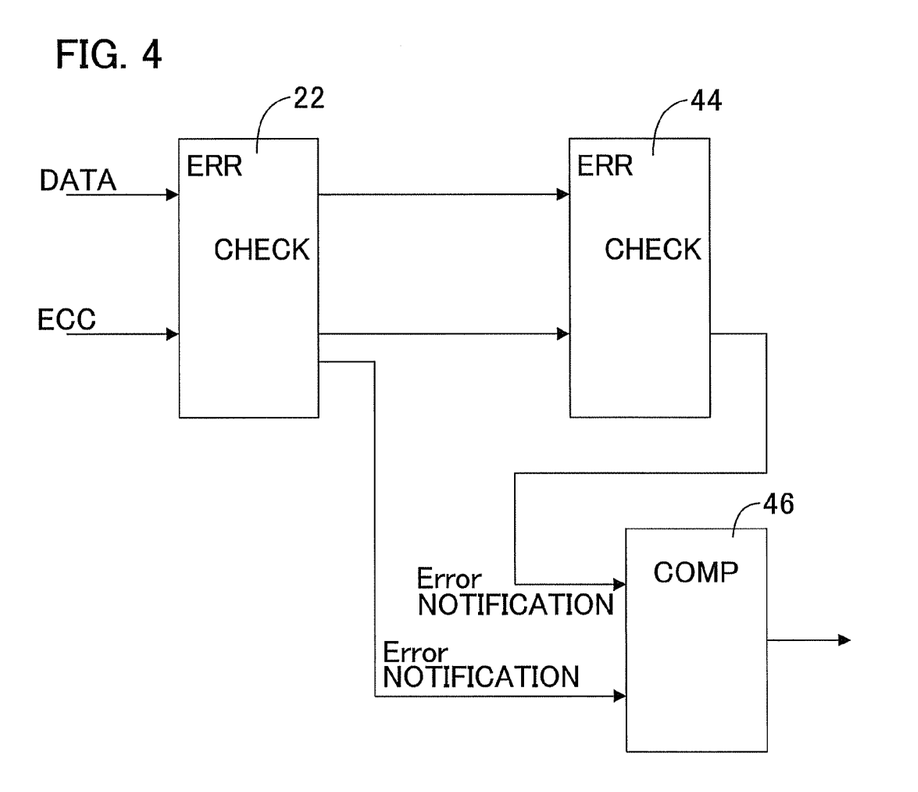
FIG. 4 shows a block diagram of an error detection configuration shown in FIG. 3.
Figure 5:
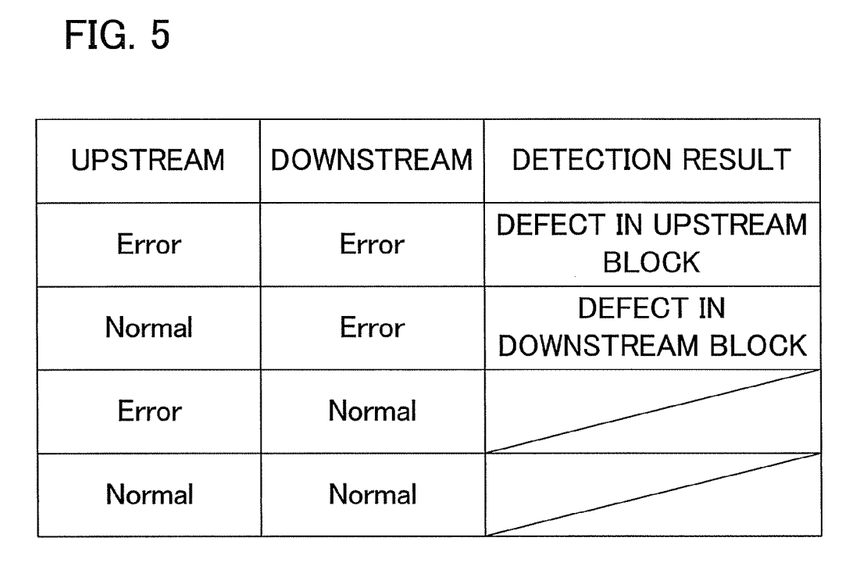
FIG. 5 shows an explanation diagram of error block identification operation shown in FIGS. 3 and 4.

FIG. 3 shows a circuit block diagram shown in FIGS. 1 and 2. FIG. 4 shows a block diagram of the configuration of an error detection circuit provided in the circuit blocks shown in FIG. 3. Also, FIG. 5 shows an explanation diagram of the detected error results by the error detection circuit shown in FIGS. 3 and 4.

FIG. 3 shows examples of the error detection/correction circuit block 2-1 and queue & buffer 2-2, provided in the CPU interface circuit 2 shown in FIG. 2. The error detection/correction circuit block 2-1 receives from the CPU a control signal (command) CT with a parity signal PA added thereto, and data with ECC (Error Correction Code) added thereto. This error detection/correction circuit block 2-1 includes a first error check circuit 20 which receives the control signal CT and the parity signal PA added thereto, and performs parity check of the control signal CT, and a second error check circuit 22 which receives the data and the ECC added thereto, and performs error detection and correction of the data.

Meanwhile, the queue & buffer 2-2 includes a first bus reception circuit 24 for receiving a control signal from the programmable bus 14-2; an address generation circuit 26 for generating an address by analyzing the control signal received on the first bus reception circuit 24; and a second bus reception circuit 28 for receiving a request from the priority circuit 6 via the programmable bus 14-4, request control circuit 2-3 and programmable bus 14-3, and informing the address generation circuit 26 of the received request.

Also, the queue & buffer 2-2 includes a third bus reception circuit 30 for receiving data from the programmable bus 14-2; a buffer RAM (Random Access Memory) 32 for storing the data received on the third bus reception circuit 30 into the address specified by the address generation circuit 26; and in response to the request from the priority circuit 6, a bus transmission circuit 34 for reading out the data in buffer RAM 32 specified from the address generation circuit 26, and for transmitting the data to the priority circuit 6 and/or the crossbar switch 7, via the programmable bus 14-3, request control circuit 2-3 and programmable bus 14-4.

In the above configuration example, the route for the control signal CT constitutes a control system path, while the data route constitutes a data system path.

The first bus reception circuit 24 includes a third error check circuit 40 for receiving the control signal CT and the parity signal PA thereof from the programmable bus 14-2, and performing parity check of the control signal CT; and a first comparison circuit 42 for detecting a defective portion by comparing an error notification received from the first error check circuit 20 with an error notification received from the third error check circuit 40.

Meanwhile, the third bus reception circuit 30 includes a fourth error check circuit 44 for receiving the control signal CT and the parity signal PA thereof from the programmable bus 14-2, and performing data error detection and correction; and a second comparison circuit 46 for detecting a defective portion by comparing an error notification received from the second error check circuit 22 with an error notification received from the fourth error check circuit 44.

The above first error check circuit 20 and the third error check circuit 40 have an identical error check function. Similarly, the second error check circuit 22 and the fourth error check circuit 44 have an identical error check function.

Next, referring to FIGS. 4 and 5, the above error check configuration will be explained. FIG. 4 shows an error check configuration in the data system path shown in FIG. 3. The similar configuration is applied for the control system path. As shown in FIG. 4, the second error check circuit 22 and the fourth error check circuit 44 for receiving the data and the ECC thereof, and performing the data error detection and correction and the comparison circuit 46 is provided as same as FIG. 3.

First, in a signal flow, the second error check circuit 22 provided on the upstream side receives data and the ECC thereof, and performs data error detection and correction. Then, the second error check circuit 22 transmits the data and the ECC thereof to the fourth error check circuit 44, and also transmits an error notification (error check result) to the comparison circuit 46, via the programmable bus 14-2.

The above fourth error check circuit 44 receives the data and the ECC thereof from the programmable bus 14-2, performs data error detection and correction, and similarly, transmits the error check result to the comparison circuit 46.

The comparison circuit 46 compares the error check result obtained from the second error check circuit 22 (error notification on the upstream side) with the error check result obtained from the fourth error check circuit 44 (error notification on the downstream side). As shown in FIG. 5, when the error notification on the upstream side indicates error, and the error notification on the downstream side also indicates error, the comparison circuit 46 determines an error occurs in the circuit block 2-1 on the upstream side. Accordingly, the comparison circuit 46 notifies the control circuit 12 shown in FIG. 1 that the upstream block 2-1 is defective, via the programmable bus 14-2.

Similarly, when the error notification on the upstream side indicates normality, while the error notification on the downstream side indicates error, the comparison circuit 46 determines an error occurs in the circuit block 2-2 on the downstream side (for example, in bus reception circuit 30). Accordingly, the comparison circuit 46 notifies the control circuit 12 shown in FIG. 1 that the upstream block 2-2 is defective, via the programmable bus 14-2.

Further, when the error notification on the upstream side indicates error, while the error notification on the downstream side indicates normality, the comparison circuit 46 does not issue any notification, because usually such a situation does not occur. Also, when the error notifications on both the upstream side and the downstream side indicate normality, the comparison circuit 46 does not issue any notification, because there is no abnormality.

As such, each error check circuit has a function of transmitting and receiving an error occurrence state to/from another error check circuit. Using this function, mutual examinations of the error occurs state are performed in the error check circuits of the blocks having logical relationship (a block on the data transmission side and a block on the data reception side). Thus, even in case of a situation such that an error propagates successively from one circuit block to another, fast identification of a circuit block of an error source can be achieved, as compared with an analysis method performed in control circuit 12.

Referring back to FIG. 1, a reconfiguration method at the time of error detection in a circuit block is explained below.

(1) When an error is detected in a circuit block, the error information is reported to the control circuit 12. For example, on detection of an error in the circuit block 3-2, the notification is sent to the control circuit 12 via the programmable bus (actually, a state monitoring bus which will be illustrated in FIG. 6) 14-2.

(2) By referring to map 12A, the control circuit 12 identifies the circuit block producing the error. Then, from ROM 10 in which logical circuit information is stored, the control circuit 12 reads out the logical circuit information of the block including the fault point.

(3) Thereafter, by referring to the map 12A, the control circuit 12 stores the logical circuit information into the reconfigurable circuit block 6-2 in the group to which the relevant fault circuit block belongs, so as to reconfigure the reconfigurable circuit block 6-2 to the function of the fault circuit block 3-2.

(4) Next, the control circuit 12 substitutes the generated normal circuit block 6-2 for the fault circuit block 3-2. More specifically, by referring to the map 12A, the control circuit 12 switches over the switches in the programmable buses 14-3 and 14-2, so as to connect the circuit block 6-2 to the circuit blocks 3-1 and 3-3.

In such a manner, LSI 1, of which function is restored after the substitution to the normal circuit, can resume normal operation. Further, even when a block which has already been substituted becomes faulty, it is possible to be substituted again if a margin in the number of reconfigurable blocks is considered in advance. Here, although the error check circuit itself is constituted in a non-reconfigurable circuit block, the connection between the error check circuits may be changed arbitrarily by means of a programmable bus circuit portion.

Next, depending on the degree of an error, each error check circuit classifies a state of being hard to continue the operation (damaged), and a state of being correctable (recoverable). Substitution operation is decided based on the classified information.

Reconfiguration Processing in Case of Fault Hard to Continue the Operation

Figure 6:
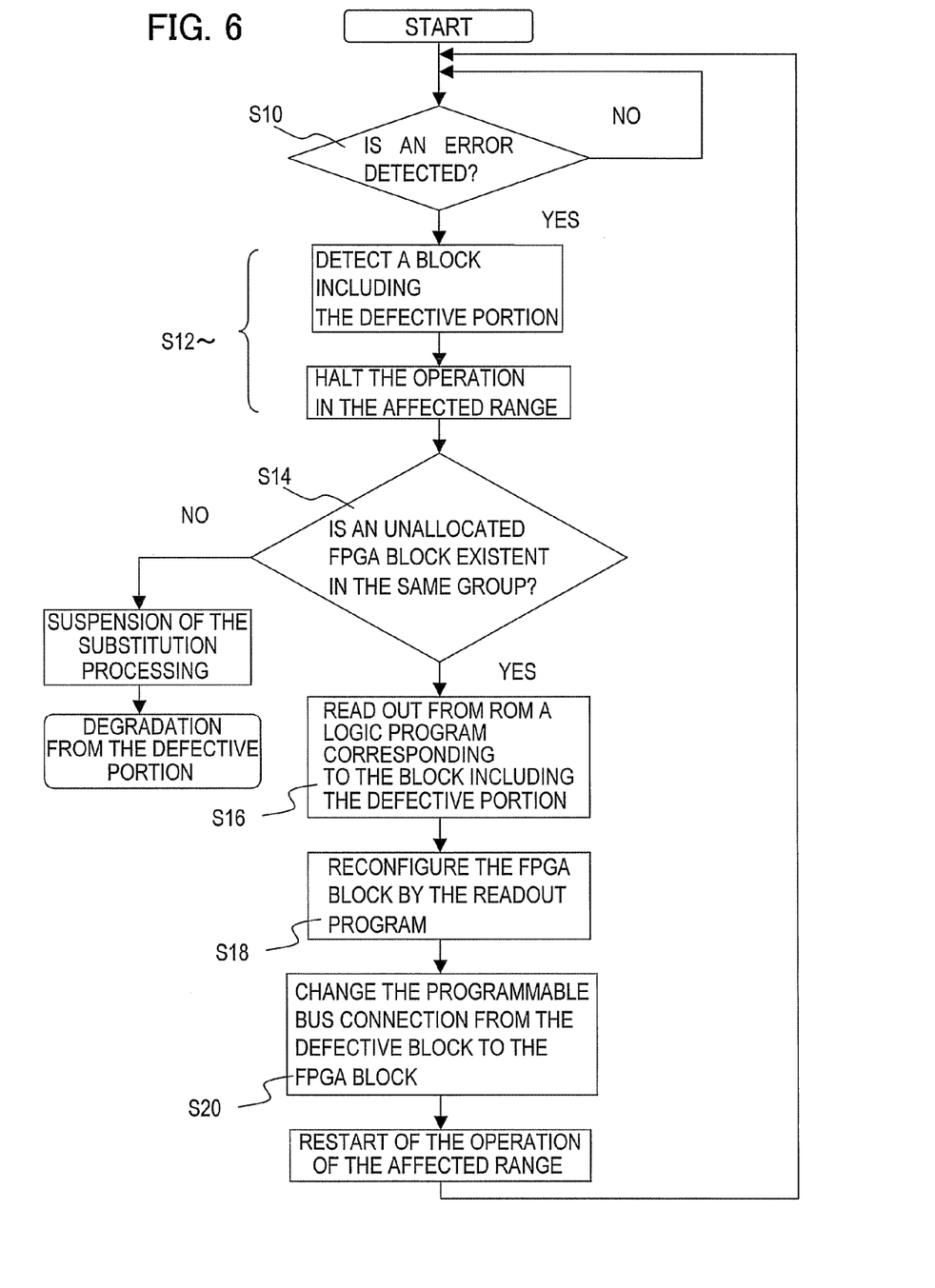
FIG. 6 shows a reconfiguration process flowchart according to a first embodiment of the present invention.
Figure 7:
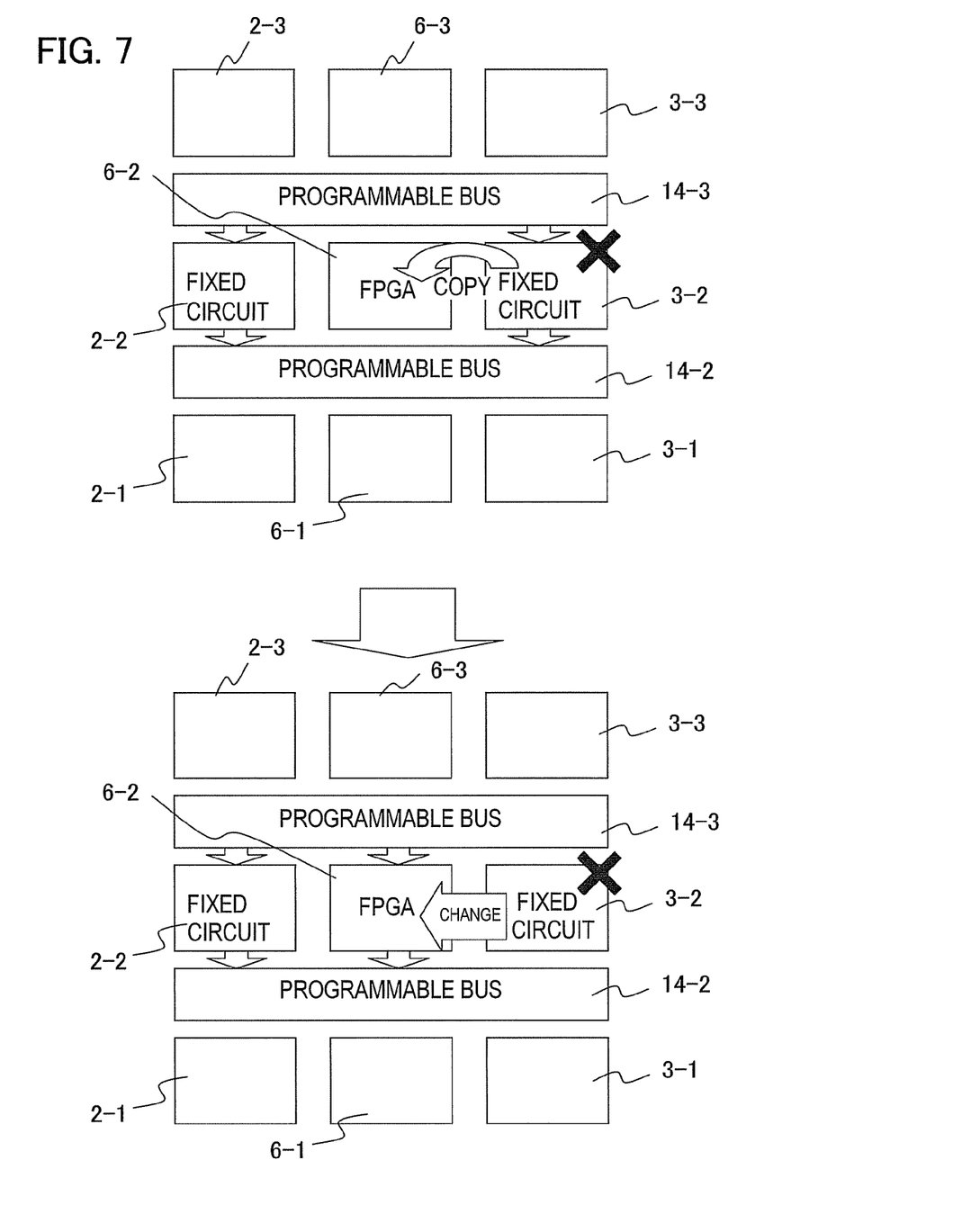
FIG. 7 shows an explanation diagram of the reconfiguration operation shown in FIG. 6.

FIG. 6 shows a reconfiguration process flowchart according to a first embodiment of the present invention, and FIG. 7 shows an explanation diagram of the operation thereof.

(S10) When the control circuit 12 receives an error notification indicating impossibility to continue normal operation of the circuit, the control circuit 12 first initializes (resets) the circuit in the range affected by the fault. When the same error occurs even after the initialization, and an error notification is received, the control circuit 12 confirms that the fixed fault occurs in the related circuit block. Here, it is also possible to confirm the occurrence of the error at the time when the first error occurs, without waiting for the repeated error after the reset.

(S12) When the error occurrence is fixed, the control circuit 12 identifies the affected range (circuit block 3-2 including the defective portion), and halts the operation thereof.

(S14) By referring to the map 12A, the control circuit 12 decides whether FPGA circuit 6-2 which has not been reconfigured is existent in the group to which the fault circuit block 3-2 belongs. In the case that the non-reconfigured FPGA circuit 6-2 is not existent, the substitution processing is suspended, and the degradation from the defective portion is performed.

(S16) On the other hand, in the case that the non-reconfigured FPGA circuit 6-2 is existent in the group to which the fault circuit block 3-2 belongs, the control circuit 12 reads out the logic information of the fault circuit block 3-2 from ROM 10 having the logic program of each circuit block stored therein. Then, the control circuit 12 expands the program related to the readout logic information into the FPGA block 6-2 in the group to which the fault block 3-2 belongs, and reconfigures the fault block 3-2 and a normal equivalent circuit, as shown in FIG. 7.

(S18) Consecutively, the control circuit 12 instructs to substitute the reconfigured block 6-2 for the fault block 3-2. Namely, as shown in FIG. 7, by referring to the map 12A, the control circuit 12 switches over the switches in the programmable bus 14-3, 14-2, so as to connect the circuit block 6-2 to the circuit blocks 3-1, 3-3. With this, the fault block 3-2 is logically disconnected from the surrounding circuits, and the reconfigured circuit 6-2 is incorporated.

(S20) After the above connection change, the control circuit 12 reinitializes circuits 3-1, 3-3 in the region affected by the fault. As a result, the fault block 3-2 is replaced by the normal substitution block 6-2, and thus the normal operation is restored.

Thus, since the reconfiguration range is limited to the block including the defective portion, the substitution processing is completed within a short time. Further, the range not affected by the substitution processing can continue the operation even during the substitution processing is in progress.

As examples of the above non-correctable (damaged) error, a multiple bit error in the data, which cannot be corrected by ECC, and a fatal error such as an error in the control signal can be listed.

Reconfiguration Processing in Case of Correctable (Recoverable) Fault

Figure 8:
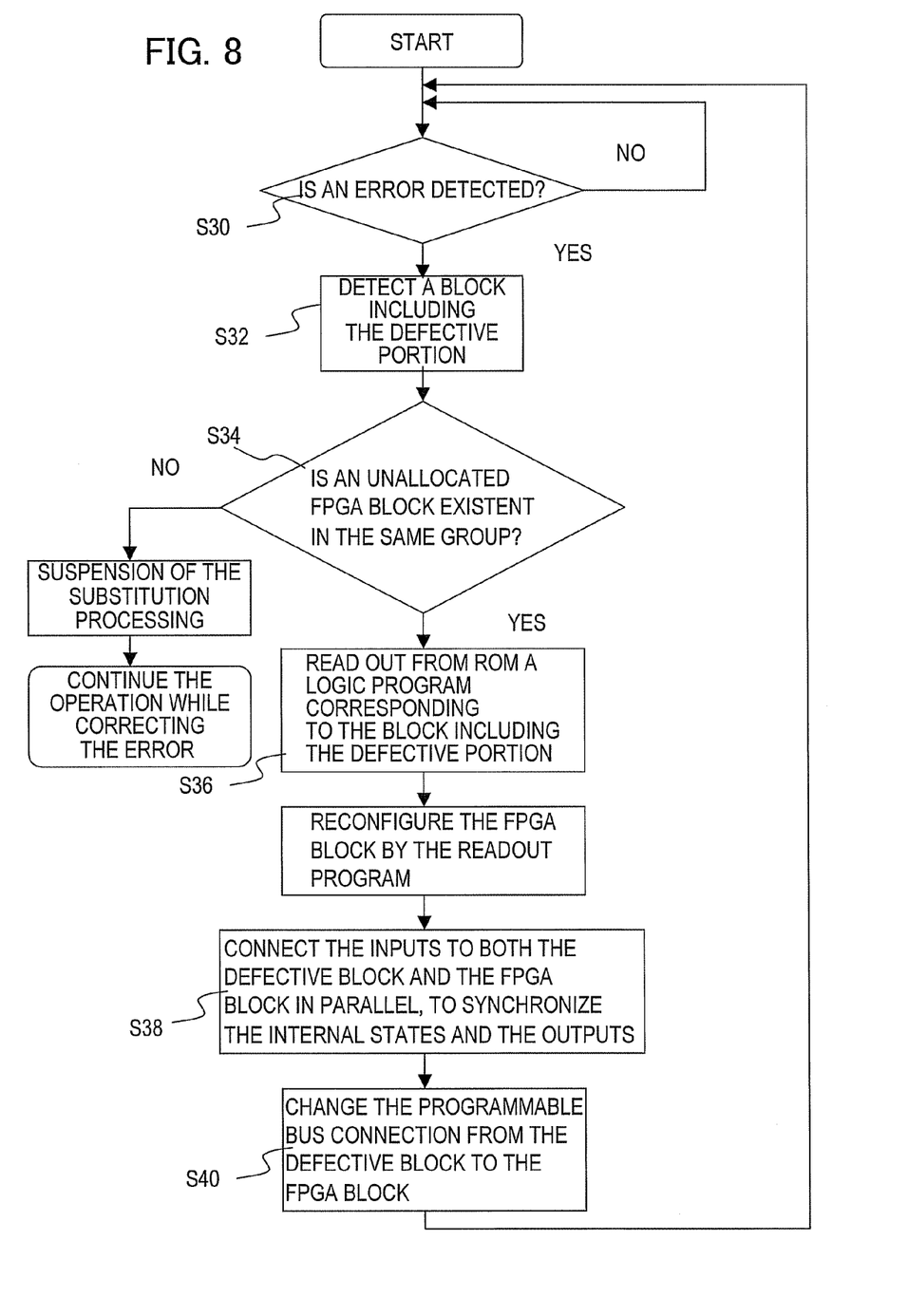
FIG. 8 shows a reconfiguration process flowchart according to a second embodiment of the present invention.
Figure 9:
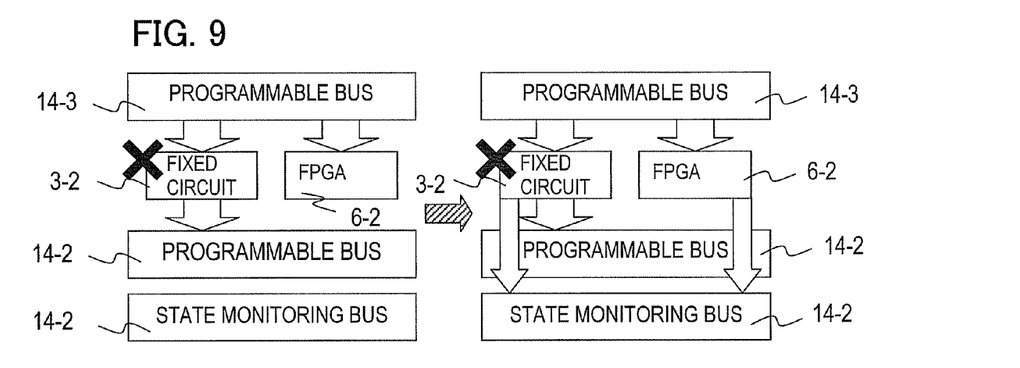
FIG. 9 shows an explanation diagram of synchronization operation in the reconfiguration shown in FIG. 8.
Figure 10:
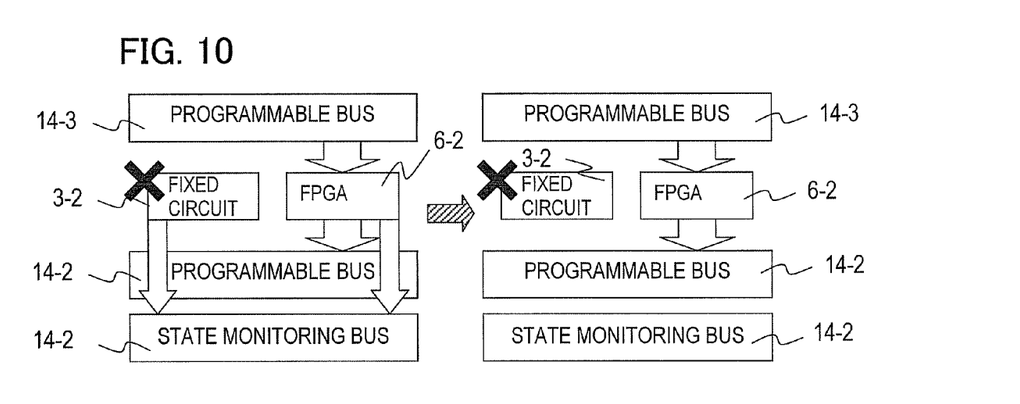
FIG. 10 shows an explanation diagram of detachment operation in the reconfiguration shown in FIG. 8.

FIG. 8 shows a reconfiguration process flowchart according to another embodiment of the present invention. Also, FIGS. 9 and 10 show explanation diagrams of the process operation shown in FIG. 8. The above example represents the processing which is selectable when an error is detected in a circuit having an error correction function by use of an error correction code such as ECC, or a circuit performing retry operation in the event of the error, thereby enabling restoration from the error state.

In a situation such that a prompt exchange is desired because of the occurrence of degradation in fault tolerability and/or performance, though continuation of the operation can be obtained to a certain extent, it is effective to apply nonstop recovery, which enables exchange of a circuit while continuing the operation.

(S30) When the control circuit 12 receives a notification of a correctable error, first, the control circuit 12 examines an error notification frequency. If the error notification frequency exceeds a threshold, the control circuit 12 decides that substitution is necessary for the circuit block concerned.

(S32) On deciding that the substitution is necessary, the control circuit 12 identifies the affected range (circuit block 3-2 including the defective portion), and halts the operation thereof.

(S34) By referring to the map 12A, the control circuit 12 decides whether the FPGA circuit 6-2 which has not been reconfigured is existent in the group to which the error-notified circuit block 3-2 belongs. In the case that the non-reconfigured FPGA circuit 6-2 is not existent, the substitution processing is suspended, and the operation is carried on while the error correction is continued.

(S36) On the other hand, in the case that the non-reconfigured FPGA circuit 6-2 is existent in the group to which the error-notified circuit block 3-2 belongs, the control circuit 12 reads out a logic program related to the logic information of the circuit block 3-2 producing the error, from ROM 10 in which the logic program of each circuit block is stored. Then, the control circuit 12 develops the readout program into FPGA block 6-2 in the group including block 3-2 producing the error, so as to reconfigure a normal circuit of equivalent function to block 3-2 having the error.

(S38) Consecutively, as shown in FIG. 9, the control circuit 12 connects the reconfigured block 6-2 to the programmable bus 14-3, and also connects the inputs to both the error circuit block 3-2 and the reconfigured circuit block 6-2 in parallel. Next, the control circuit 12 connects both the error circuit block 3-2 and the reconfigured circuit block 6-2 to state monitoring bus 14-2' attached to programmable bus 14-2, and connects both the outputs and the internal states of circuit blocks 3-2, 6-2 via state monitoring bus 14-2', so as to synchronize between the circuit blocks 3-2, 6-2.

(S40) On completion of the above synchronization, the control circuit 12 instructs a substitution. Namely, by referring to the map 12A, the control circuit 12 switches over the switches in the programmable buses 14-3, 14-2, so as to connect the circuit block 6-2 to the circuit blocks 3-1, 3-3, as shown in FIG. 10. With this, the fault circuit block 3-2 is logically disconnected from the surrounding circuits, and the reconfigured circuit 6-2 is built in. Thereafter, the circuit block 3-2 is disconnected from the state monitoring bus 14-2'.

Instead of the method of performing automatic substitution processing when the error occurrence frequency exceeds the preset threshold, it is also possible to select a method of executing the switchover when an accumulated number of errors exceeds a preset threshold, without executing halt and initialization processing.

In such a case, the circuit function of the defective block is copied to FPGA block 6-2, while continuing the operation, and only the input signal is connected in parallel. On completion of synchronization between the two circuit states, the defective block is disconnected by changing the output connection. In addition, the synchronization is confirmed by comparing between the output signals, as well as the internal state monitoring signals.

Other Embodiments

It is effective to record the substitution processing information. The information in regard to the block to which the substitution processing is performed is recorded into a nonvolatile memory (shown by map 12A) in the control circuit 12, which is retained even when the system power supply is turned off.

At the time of reentering the power, the entire setting of the FPGA block to be used for the substitution processing is performed automatically. Also, it is possible to perform rearrangement such as reallocation of an already allocated substitution block to a circuit block which has a higher degree of importance.

Further, although the above description is given to a system controller having an interface circuits shown in FIG. 2, it is also possible to apply to a circuit having a different function.

To summarize the effects of the present invention, the substitution processing can be completed substantially in a short time, because a fixed circuit is divided into a plurality of functional circuit blocks, which are connected through program buses, and moreover, a reconfigurable circuit is provided corresponding to each of the plurality of functional circuit blocks. Further, even during substitution processing, it is possible to continue operation in the range not affected by the substitution processing.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. The logic integrated circuit having a dynamic substitution function, comprising:
   a circuit divided into a plurality of fixed functional circuit blocks;
   a reconfigurable circuit having a plurality of reconfigurable circuit blocks corresponding to the plurality of fixed functional circuit blocks;
   a programmable bus connecting each fixed functional circuit block and each reconfigurable circuit block;
   a memory storing reconfiguration data of the fixed functional circuit blocks; and
   a control circuit, in response to a detected error of a fixed functional block, reading out from the memory the reconfiguration data of the fixed functional circuit block having the detected error, and reconfiguring the reconfigurable circuit into the fixed functional circuit block having the detected error, using the reconfiguration data, wherein:
      each of the plurality of functional circuit blocks further comprises an error detection circuit which detects an error in a transmission signal or a reception signal, transferred among the plurality of functional circuit blocks; and
      said logic integrated circuit further comprises a comparison circuit provided in at least one of the plurality of functional circuit blocks which performs transmission and reception, and identifies the functional circuit block producing the error by examining the error occurrence state in the error detection circuit.

2. The logic integrated circuit having a dynamic substitution function according to claim 1, wherein;
   the programmable bus is set so as to connect the plurality of fixed functional circuit blocks related to a single logic circuit; and
   the control circuit disconnects the fixed functional circuit block having the detected error from the programmable bus, and connects the reconfigured circuit to the programmable bus to connect the reconfigured circuit to one of the fixed functional circuit blocks other than the fixed functional circuit block having the detected error 3. The logic integrated circuit having a dynamic substitution function according to claim 1, wherein:
   on receipt of the result of identification from the comparison circuit, the control circuit identifies the reconfigurable circuit corresponding to the fixed functional circuit block having the detected error.

4. The logic integrated circuit having a dynamic substitution function according to claim 1, wherein:
   the control circuit further comprises a map storing an allocation of the plurality of fixed functional circuit blocks, and
   in response to the error detection in the fixed functional circuit block, the control circuit identifies the fixed functional circuit block having the detected error and the reconfigurable circuit corresponding to the fixed functional circuit block, by referring to the map.

5. The logic integrated circuit having a dynamic substitution function according to claim 4, wherein:
   the control circuit updates the map in response to the reconfiguration completion of the identified reconfigurable circuit into the fixed functional circuit block having the detected error.

6. The logic integrated circuit having a dynamic substitution function according to claim 1, wherein:
   said control circuit identifies the reconfigurable circuit block corresponding to the fixed functional circuit block having the detected error and reconfigures the identified reconfigurable circuit block into the fixed functional circuit block having the detected error.

7. The logic integrated circuit having a dynamic substitution function according to claim 1, wherein the control circuit disconnects the fixed functional circuit block having the detected error from the programmable bus and connects the reconfigured circuit to the programmable bus.

8. The logic integrated circuit having a dynamic substitution function according to claim 1, wherein:
   said control circuit operates such that the logic circuit divided into the plurality of fixed functional circuit blocks and the reconfigurable circuit divided into the plurality of blocks are grouped.

9. An information processing apparatus comprising a logic integrated circuit having a dynamic substitution function, said logic integrated circuit comprising:
   a circuit divided into a plurality of fixed functional circuit blocks;
   a reconfigurable circuit having a plurality of reconfigurable circuit blocks provided correspondingly to the plurality of fixed functional circuit blocks;
   a programmable bus which connects each fixed functional circuit block and each reconfigurable circuit block;
   a memory storing reconfiguration data of the fixed functional circuit blocks; and
   a control circuit reading out from the memory the reconfiguration data of the fixed functional circuit block having a detected error, and reconfiguring the reconfigurable circuit into the fixed functional circuit block having the detected error, using the reconfiguration data in response to an error detection of the fixed functional circuit block, wherein:
      each of the plurality of fixed functional circuit blocks further comprises an error detection circuit which detects an error in a transmission signal or in a reception signal transferred among the plurality of fixed functional circuit blocks; and
      said logic integrated circuit further comprises a comparison circuit in at least one of the plurality of fixed functional circuit blocks which performs transmission and reception and identifies the fixed functional circuit block producing the error, by examining the error occurrence state in the corresponding error detection circuit.

10. The information processing apparatus according to claim 9, wherein:
    the programmable bus is set so as to connect the plurality of fixed functional circuit blocks related to the single circuit; and
    the control circuit disconnects the fixed functional circuit block having the detected error from the programmable bus, and connects the reconfigured circuit to the programmable bus to connect the reconfigured circuit to one of the fixed functional circuit blocks other than the fixed functional circuit block having the detected error.

11. The information processing apparatus according to claim 9, wherein:
    on receipt of the result of identification from the comparison circuit, the control circuit identifies the reconfigurable circuit corresponding to the fixed functional circuit block having the detected error.

12. The information processing apparatus according to claim 9, wherein the control circuit further comprises:
   a map storing an allocation of the plurality of fixed functional circuit blocks; and
   in response to the error detection in the fixed functional circuit block, the control circuit identifies the fixed functional circuit block having the detected error and the reconfigurable circuit corresponding to the fixed functional circuit block, by referring to the map.

13. The information processing apparatus according to claim 12, wherein:
   the control circuit updates the map in response to the reconfiguration completion of the identified reconfigurable circuit into the fixed functional circuit block having the detected error.

14. The information processing apparatus according to claim 9, wherein:
   said control circuit identifies the reconfigurable circuit block corresponding to the fixed functional circuit block having the detected error and reconfigures the identified reconfigurable circuit block into the fixed functional circuit block having the detected error.

15. The information processing apparatus according to claim 9, wherein:
   the control circuit disconnects the fixed functional circuit block having the detected error from the programmable bus and connects the reconfigured circuit to the programmable bus.

16. The information processing apparatus according to claim 9, wherein:
   said control circuit operates such that the circuit divided into the plurality of fixed functional circuit blocks and the reconfigurable circuit divided into the plurality of blocks are grouped.

17. A dynamic substitution method of a logic integrated circuit, comprising:
   detecting an error in a fixed functional circuit block of a plurality of fixed functional circuit blocks;
   reading out reconfiguration data of the fixed functional circuit block having the detected error from a memory storing the reconfiguration data of the fixed functional circuit block; and
   reconfiguring a reconfigurable circuit out of a plurality of reconfigurable circuit blocks corresponding to the plurality of functional circuit blocks, to the fixed functional circuit block having the detected error, using the reconfiguration data
   wherein said error detecting comprises:
      detecting an error in a transmission signal or a reception signal, transferred among the plurality of fixed functional circuit blocks, by an error detection circuit; and
      identifying the fixed functional circuit block producing the error by examining an error occurrence state in the error detection circuit by a comparison circuit in at least one of the plurality of fixed functional circuit blocks.

18. The dynamic substitution method of a logic integrated circuit according to claim 17, further comprising:
   disconnecting the fixed functional circuit block having the detected error from the programmable bus which connects each fixed functional circuit block; and
   connecting the reconfigured circuit to the programmable bus.

* * * * *

UNITED STATES PATENT AND TRADEMARK OFFICE
CERTIFICATE OF CORRECTION

PATENT NO. : 7,535,255 B2  Page 1 of 1
APPLICATION NO. : 11/277625
DATED : May 19, 2009
INVENTOR(S) : Nobuyoshi Aida et al.

It is certified that error appears in the above-identified patent and that said Letters Patent is hereby corrected as shown below:

Column 11, Line 35, change "wherein;" to --wherein:--.

Column 11, Line 44, change "error" to --error.--.

Column 14, Line 13, change "data" to --data,--.

Signed and Sealed this

Sixth Day of October, 2009

David J. Kappos
*Director of the United States Patent and Trademark Office*